United States Patent
Samaras et al.

[11] Patent Number: 5,991,161
[45] Date of Patent: *Nov. 23, 1999

[54] MULTI-CHIP LAND GRID ARRAY CARRIER

[75] Inventors: William A. Samaras, San Jose; Paul T. Phillips, Carmel; Michael P. Brownell, Los Gatos, all of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,793

[22] Filed: Dec. 19, 1997

[51] Int. Cl.$^6$ ...................................................... H05K 1/18
[52] U.S. Cl. ........................... 361/760; 361/762; 361/763; 361/764; 361/765; 361/766; 361/767; 257/782; 257/780; 257/773; 257/737; 174/16.3; 439/68; 439/69
[58] Field of Search ..................................... 361/760, 762, 361/767, 766, 782, 783, 684, 686, 715, 763, 764, 765; 257/686, 723, 782, 780, 774, 773, 738, 690, 724, 737; 174/16.3; 439/68, 69, 83, 485

[56] References Cited

U.S. PATENT DOCUMENTS

| | | | |
|---|---|---|---|
| 4,074,342 | 2/1978 | Honn et al. | 361/779 |
| 5,313,366 | 5/1994 | Gaudenzi et al. | 361/760 |
| 5,598,033 | 1/1997 | Behlen et al. | 257/686 |
| 5,703,753 | 12/1997 | Mok | 361/715 |

*Primary Examiner*—Leo P. Picard
*Assistant Examiner*—David Foster
*Attorney, Agent, or Firm*—Blakely, Sokloff, Taylor & Zafman LLP

[57] ABSTRACT

A land grid array (LGA) carrier includes an interposer having a first surface and a second surface opposite the first surface, with a plurality of locations on the first surface adapted to receive a plurality of semiconductor dice and passive components. The second surface has a plurality of conductive pads coupled thereto.

17 Claims, 2 Drawing Sheets

MULTI-CHIP LAND GRID ARRAY CARRIER

BACKGROUND OF THE INVENTION

1. Field of the Invention

The invention relates generally to chip carriers, and more specifically, to a multi-chip land grid array carrier.

2. Description of Related Art

Computer processors include various cache memories, including memory caches and disk caches. A memory cache is a portion of memory made of high-speed static random access memory (SRAM) instead of the slower and cheaper dynamic RAM (DRAM) used for main memory. Memory caching is effective because most programs access the same data or instructions over and over. By keeping as much of this information as possible in SRAM, the computer avoids accessing the slower DRAM.

Some memory caches are built into the architecture of microprocessors. Such internal caches are often called primary, or Level 1 (L1) caches. Many computers also come with external cache memory, called Level 2 (L2) caches. The L2 cache is coupled to a dedicated bus, sometimes referred to as a "backside bus." Like L1 caches, L2 caches are composed of SRAM but they are typically much larger. The L2 cache improves system-level performance by improving the processor's memory read and write performance, as well as decreasing the system bus utilization. The large L2 cache results in less processor read requirements to main memory, thereby reducing the number of times the processor needs to access the system bus.

For example, the Intel® Pentium® Pro processor package includes the microprocessor chip and an L2 cache die packaged in a single package. The microprocessor chip and the L2 cache memory die are both mounted in a dual-cavity microprocessor package. The microprocessor package may then be mounted on a system motherboard. The tight coupling of the microprocessor chip and the L2 cache improves system performance and efficiency. The Pentium® Pro processor architecture is described in the Intel Architecture Software Developer's Manual, Volume 1: Basic Architecture, 1996/1997, available from Intel® Corporation, and in Pentium® Pro Processor System Architecture, Mindshare, Inc., 1997, both of which are incorporated by reference herein in their entirety.

While cache devices are often implemented using multiple memory chips, a design such as the Pentium® Pro L2 cache comprises a single die. The size of the L2 cache varies according to various models of the Pentium® Pro available. For example, the processor may be implemented with 256 KB, 512 KB, 1MB, etc. of L2 cache capacity. Manufacturing the single, large memory die for the L2 cache may be difficult and expensive. Defects in a single-die L2 cache may not be discoverable until after the processor and L2 cache die are assembled into their shared package. If a defect is found in the L2 cache after it is assembled into the microprocessor package, the entire package often must be scrapped. Thus, it may be desirable to implement the L2 cache in a manner that allows additional flexibility and simplifies manufacturing and testing.

Mounting the cache memory chips directly to a motherboard, as in many prior art cache implementations, greatly reduces performance. With cache memory implemented on the motherboard, each semiconductor die comprising the memory device is typically mounted in a conventional single-die package. The single-die packages are then soldered directly to the motherboard or mounted in sockets. The speed at which the cache runs is significantly slower when implemented on the motherboard.

In a compromise solution, single-die memory devices are coupled to a daughterboard along with the microprocessor. The daughterboard is then plugged into the motherboard. While this cache implementation improves performance over directly mounting the cache memory packages on the motherboard, it requires a larger footprint since the cache comprises several conventional single-die packages. Moreover, the daughterboard implementation still operates at a significantly slower speed than an integrated L2 cache. In one prior art daughterboard L2 cache implementation, the L2 cache operates at only half the speed of the processor.

Rather than using several single-die memory devices for an L2 cache, several semiconductor dies could be directly mounted in a processor package using conventional methods, such as controlled collapse chip connection (C4). This also has drawbacks. For example, the memory device semiconductor die may not be tested until mounted along with the microprocessor chip. If a single memory chip is defective, the entire microprocessor package must be scrapped, as removing and replacing a single semiconductor die is, at best, very difficult if not impossible.

The present invention addresses some of the above mentioned and other problems of the prior art.

SUMMARY OF THE INVENTION

In one aspect of the invention, a land grid array (LGA) carrier includes an interposer having a first surface and a second surface opposite the first surface, with a plurality of locations on the first surface adapted to receive a plurality of semiconductor dies and passive components. The second surface has a plurality of conductive pads coupled thereto.

In another aspect of the invention a method of assembling a multi-chip device includes fabricating an interposer having a first surface and a second surface and populating the second surface with a plurality of conductive pads. A solder ball is coupled to each of predefined conductive pads, and a plurality of semiconductor dies and a plurality of passive devices are coupled to the first surface.

BRIEF DESCRIPTION OF THE DRAWINGS

Other objects and advantages of the invention will become apparent upon reading the following detailed description and upon reference to the drawings in which.

Figure 1:
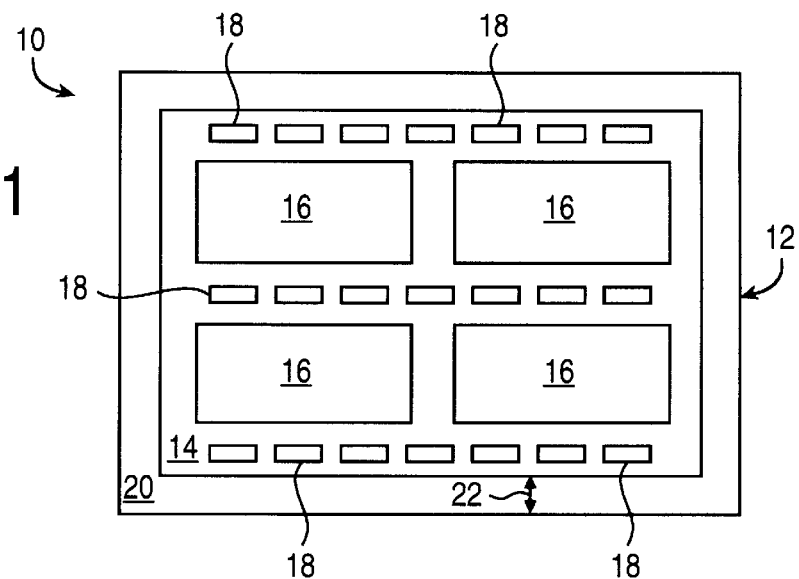
FIG. 1 is a plan view of a first surface of a multi-chip land grid array (LGA) carrier in accordance with an embodiment of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
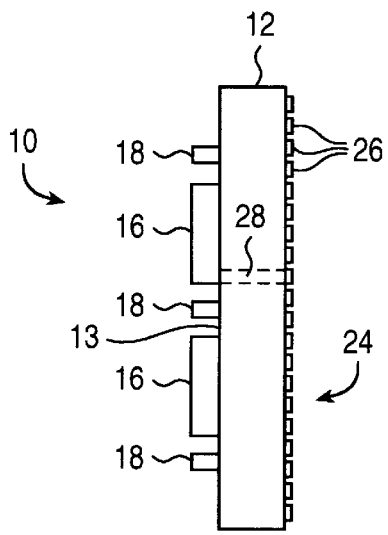
FIG. 2 is an end view of the multi-chip LGA carrier of FIG. 1.

FIG. 1 is a plan view and FIG. 2 is an end view illustrating an exemplary land grid array (LGA) carrier 10 in accordance with an embodiment of the invention. The LGA carrier 10 includes an interposer 12, which in one embodiment of the invention is fabricated out of organic advanced circuit board material, as is known in the art. The interposer provides a substrate to which electronic components are coupled, thus acting as a multi-chip subassembly in a multi-chip package. The top surface 13 of the interposer 12 includes a first portion 14 that is adapted to receive a plurality of semiconductor dies 16 and passive components 18, such as capacitors, resistors and inductors. The semiconductor dies 16 may be coupled to the first portion 14 using controlled collapse chip connection (C4), as is known in the art. Other methods of coupling the semiconductor dies 16 may also be employed.

The interposer 12 may include a second portion 20 located about the periphery of the interposer 12 top surface 13. Particular embodiments of the interposer 12 employ the second portion 20 to provide a "handling area," supplying adequate space for assembly machines, such as automated pick-and-place devices, to handle the interposer 12. In one embodiment, the second portion 20 is about 5 to 7 mm wide (reference 22).

The interposer 12 further includes a bottom surface 24 that has a plurality of conductive pads 26 coupled thereto. A plurality of conductive traces (not shown) are placed within the interposer 12 in a predefined manner to route power, signals, etc. to the components 16, 18 and electrically couple the various components 16, 18 together. The conductive traces also selectively couple the components 16, 18 to a plurality of vias 28, which in turn, couple the components 16, 18 to at least some of the conductive pads 26.

Figure 3:
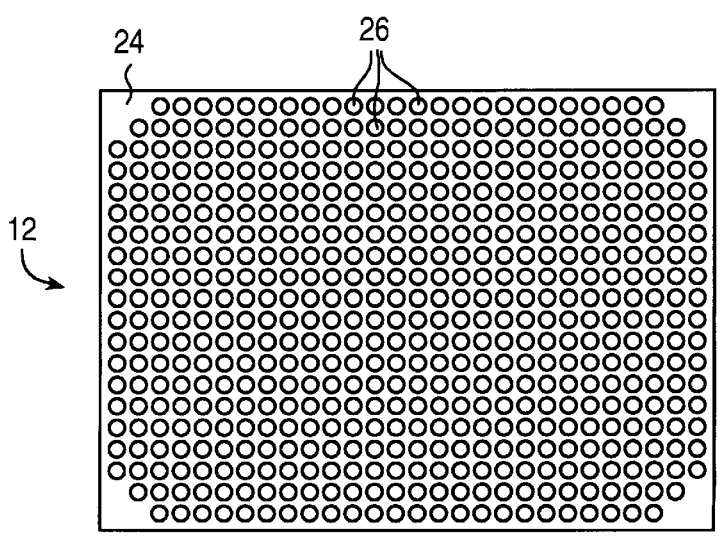
FIG. 3 is a plan view illustrating the bottom portion of an embodiment of the LGA chip carrier in accordance with the invention.

FIG. 3 illustrates the bottom surface 24 of an embodiment of the interposer 12 in accordance with the present invention. In the embodiment of the interposer 12 illustrated in FIG. 3, the plurality of conductive pads 26 cover essentially the entire bottom surface 24. In the embodiment of FIG. 3, the conductive pads 26 are arranged in an array of rows and columns, though alternate arrangements may be used. In one embodiment, the array of conductive pads 26 includes 41 rows and 27 columns, while in another embodiment, the array includes 41 rows and 45 columns. Thus, the bottom surface 24 may include over 1,800 conductive pads. Some of the conductive pads 26 are coupled to the vias 28, in turn coupling the conductive pads 26 to the components 16, 18 on the top surface 13, while other conductive pads 26 are not coupled to the vias 28.

Figure 4:
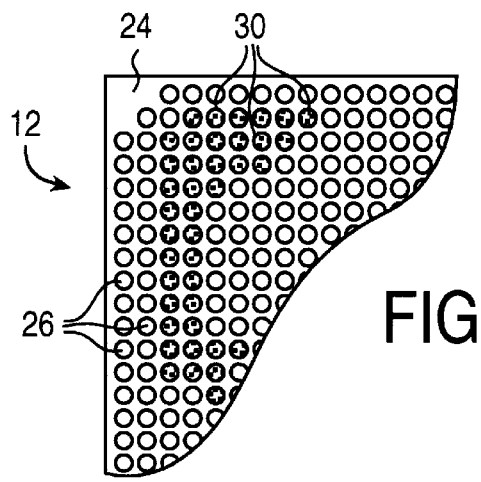
FIG. 4 is a partial plan view showing a portion of the bottom portion of an embodiment of the LGA chip carrier in accordance with the invention, illustrating solder balls coupled to some of the conductive pads.
Figure 5:
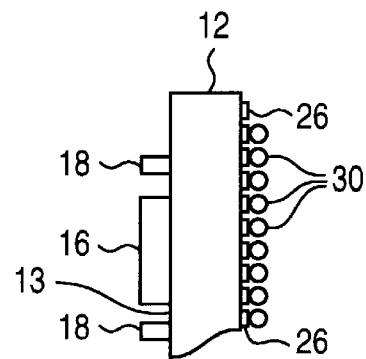
FIG. 5 is a partial end view of the embodiment illustrated in FIG. 4.

FIG. 4 is a partial plan view of the bottom surface 24, and FIG. 5 is a partial end view of the interposer 12 of an embodiment of the invention. The conductive pads 26 that are electrically coupled to the components 16, 18 on the top surface 13 of the interposer 12 have a solder ball 30 attached thereto for coupling the interposer 12 to a surface of another substrate (not shown) or other device. Alternatively, the conductive pads 26 that are electrically coupled to the components 16, 18 may have pins (not shown) attached thereto for coupling the interposer 12 to the substrate or other device.

Moreover, the conductive pads 26 that are not coupled to the components 16, 18 on the top surface 13 do not have a solder ball 30 attached thereto. Thus, essentially the entire bottom surface 24 of the interposer 12 may be populated with conductive pads 26, but only preselected conductive pads 26 have a solder ball 30 coupled thereto. In other words, this embodiment of the present invention provides a large, ball grid array (BGA) device that includes unused pads 26 on the bottom surface 24. Pads that are unused in the specific device do not have solder balls attached thereto. This adds flexibility in design and rework of specific embodiments of the LGA carrier 10. Still further, in one embodiment, only a preselected portion of the conductive pads 26 having solder balls 30 coupled thereto are tested during the manufacturing process, additionally reducing manufacturing costs.

Figure 6:
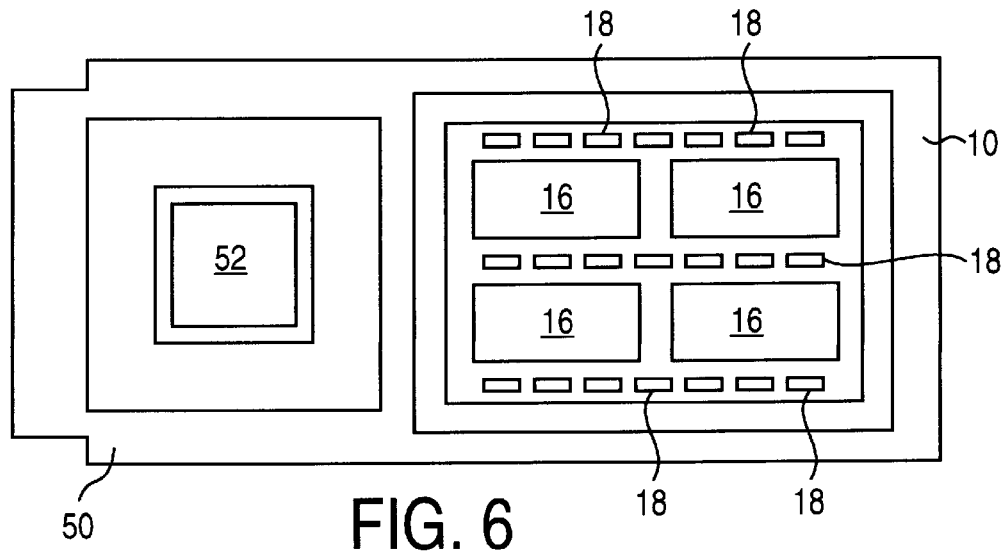
FIG. 6 is a plan view illustrating an embodiment of an LGA carrier in accordance with the invention, coupled to a substrate with a single chip package.

FIG. 6 is a plan view, illustrating an embodiment of an LGA carrier 10, in accordance with an embodiment of the invention, coupled to another substrate 50, along with a single-chip device 52. The interposer 12 includes a plurality of semiconductor dies 16 and passive devices 18 coupled to the interposer 12. In one embodiment, the single-chip device 52 comprises a microprocessor device, and the semiconductor dies 16 comprise memory chips that function as an L2 cache of the microprocessor device. The passive components 18 may include capacitors, resistors and inductors arranged as filters to facilitate high-speed device operation. Thus, the interposer acts as a multi-chip subassembly in a multi-chip package. In FIG. 6, the interposer 12 is shown having four semiconductor dice 16 coupled thereto, though other arrangements, including different quantities of semiconductor dice, are envisioned.

Coupling the semiconductor dies 16 to the interposer 12, as illustrated in FIG. 6, rather than coupling the semiconductor dies 16 directly to the substrate 50, allows pretesting of the semiconductor dies 16. For example, if the semiconductor dies 16 comprise memory chips of a microprocessor L2 cache, the memory chips may be tested "at speed" prior to being coupled to the substrate 50, along with the microprocessor device 52. If the pretesting discovers defects, the LGA carrier 10 may be reworked or scrapped prior to coupling the interposer 12 to the substrate 50. The LGA carrier 10 allows simpler attachment of multiple semiconductor dies 16 to the substrate 50. Once the LGA carrier 10 multi-chip subassembly is implemented in a multi-chip assembly, as in FIG. 6, the multiple semiconductor dies 16 may be simultaneously removed from the substrate 50 of defective assemblies, if necessary.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A land grid array (LGA) carrier, comprising:

an interposer having a first surface and a second surface opposite the first surface;

a plurality of locations on the first surface adapted to receive a plurality of semiconductor dies and passive components, wherein the passive components are selected from a group comprising resistors, capacitors, and inductors; and, a plurality of conductive pads coupled to the second surface and electrically coupled with selected ones of the semiconductor dies and passive components.

2. The LGA carrier of claim 1 further comprising a plurality of solder balls, wherein at least some of the conductive pads have one of the solder balls attached thereto.

3. The LGA carrier of claim 1 further comprising a plurality of pins, wherein at least some of the conductive pads have one of the pins attached thereto.

4. The LGA carrier of claim 1, wherein the interposer is fabricated out of an organic material.

5. The LGA carrier of claim 1 further comprising a plurality of conductive traces in the interposer arranged to electrically couple the locations in a predefined manner, the conductive traces further electrically coupled to at least some of the conductive pads.

6. The LGA carrier of claim 5 wherein at least some of the conductive pads do not have conductive traces electrically coupled thereto.

7. The LGA carrier of claim 1, wherein the conductive pads are configured in an array of rows and columns.

8. The LGA carrier of claim 7 wherein the array comprises at least 40 rows and at least 45 columns.

9. The LGA carrier of claim 8 wherein the plurality of conductive pads comprises at least 1,800 conductive pads.

10. The LGA carrier of claim 8 wherein the array of conductive pads covers essentially the entire second surface.

11. The LGA carrier of claim 1 wherein the first surface comprises first and second portions, wherein the first portion is adapted to receive the plurality of semiconductor dies and passive components.

12. The LGA carrier of claim 11 wherein the second portion is located about the periphery of the first surface, generally surrounding the first portion.

13. The LGA carrier of claim 12 wherein the second portion is not adapted to receive the semiconductor dies and passive components.

14. The LGA carrier of claim 1 further comprising a plurality of semiconductor dies coupled to the first surface.

15. The LGA carrier of 14 wherein at least one of the plurality of semiconductor dies comprises a memory chip.

16. The LGA carrier of claim 14 wherein at least one of the plurality of semiconductor dies is coupled to the first portion using controlled collapse chip connection (C4).

17. The LGA carrier of claim 14 further comprising a plurality of passive components coupled to the first surface.

* * * * *